(12) United States Patent
Schindel

(10) Patent No.: US 7,275,298 B2
(45) Date of Patent: Oct. 2, 2007

(54) ULTRASONIC PRINTED CIRCUIT BOARD TRANSDUCER

(76) Inventor: David W. Schindel, 460 Wilbrod Street, Suite 2, Ottawa, Ontario K1N 6M8 (CA)

( * ) Notice: Subject to any disclaimer, the term of this patent is extended or adjusted under 35 U.S.C. 154(b) by 489 days.

(21) Appl. No.: 10/493,346

(22) PCT Filed: Oct. 23, 2002

(86) PCT No.: PCT/CA02/01601

§ 371 (c)(1),
(2), (4) Date: Apr. 22, 2004

(87) PCT Pub. No.: WO03/035281

PCT Pub. Date: May 1, 2003

(65) Prior Publication Data

US 2004/0261251 A1    Dec. 30, 2004

Related U.S. Application Data

(60) Provisional application No. 60/330,484, filed on Oct. 23, 2001.

(51) Int. Cl.
*H04R 31/00* (2006.01)

(52) U.S. Cl. .................. 29/594; 29/592.1; 29/609.1; 216/62; 216/66; 216/67; 310/334; 381/396; 381/398; 367/140; 427/79; 427/80

(58) Field of Classification Search ............... 29/592.1, 29/594, 609.1; 216/62, 66, 67; 310/334; 381/396, 398; 427/79, 80; 367/140
See application file for complete search history.

(56) References Cited

U.S. PATENT DOCUMENTS

| 4,993,072 A | | 2/1991 | Murphy | |
| 5,153,859 A | * | 10/1992 | Chatigny et al. | 367/140 |
| 5,287,331 A | * | 2/1994 | Schindel et al. | 367/140 |
| 5,475,606 A | | 12/1995 | Muyshondt et al. | 364/489 |

FOREIGN PATENT DOCUMENTS

| EP | 04 99 237 | 8/1992 |
| GB | 2 231 235 | 11/1999 |

* cited by examiner

*Primary Examiner*—Paul D. Kim

(57) ABSTRACT

There is provided methods for producing an ultrasonic transducer assembly. The methods generally comprise the steps of creating a multi-layered rigid or flexible printed circuit board, having a top surface and bottom surface; creating a patterned conducting layer upon each of the top and bottom surface; creating at least one patterned backplate electrode on the board or as part of a discreet component which is then attached to the board; creating at least one conductive through-hole via integral with the board; roughening at least a portion of each of the at least one backplate to introduce gas pockets in that portion of a surface of the backplate; and attaching thin insulating or dielectric single or multi-layer film on a portion of the board in which the film has an integral conducting surface and in which the conducting surface is configured so as to form a capacitive structure with the at least one backplate.

51 Claims, 4 Drawing Sheets

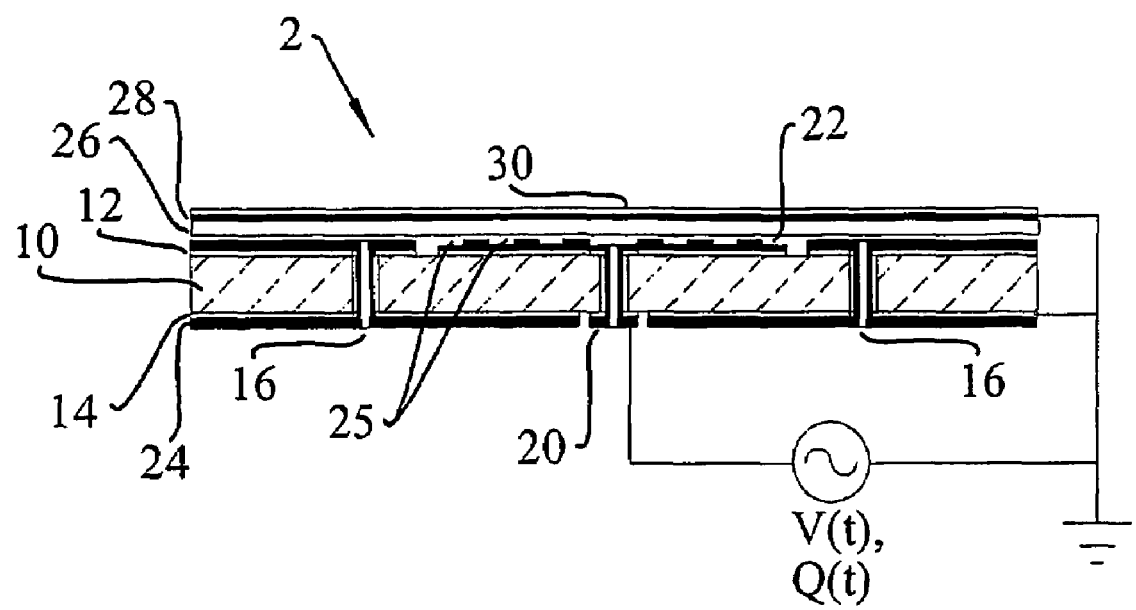
Figure 1
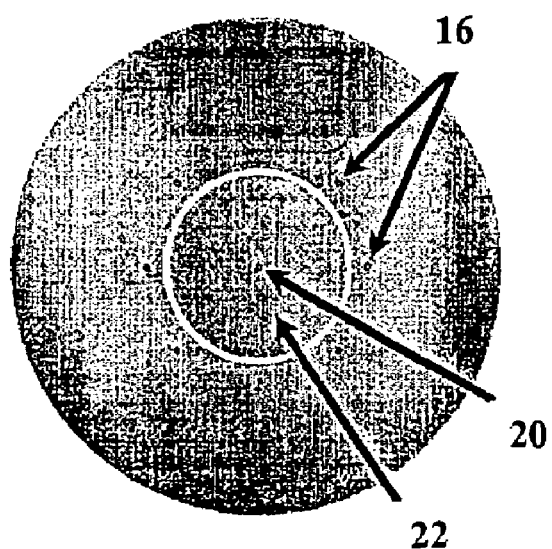
Figure 2a
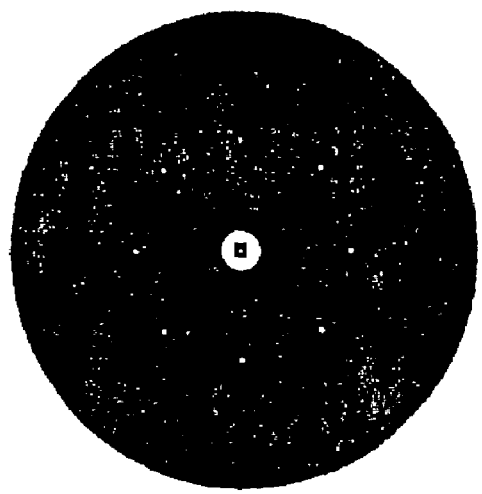
Figure 2b
Figure 2

ULTRASONIC PRINTED CIRCUIT BOARD TRANSDUCER

CROSS REFERENCE TO RELATED APPLICATIONS

The present application claims priority to U.S. application Ser. No. 60/330,484, filed Oct. 23, 2001, which application is incorporated herein fully by this reference.

FIELD OF INVENTION

This invention relates to an ultrasonic printed circuit board transducer assembly and example methods for making the assembly.

BACKGROUND OF THE INVENTION

Earlier patents, among them U.S. Pat. No. 5,287,331 & Canadian Patent 2,105,647, describe a method for manufacturing gas- and liquid-coupled ultrasonic capacitive-type transducers that are operable over a large frequency bandwidth (~40 kHz-2 MHz). That method involves using micromachining or IC manufacturing techniques to make well-defined pitted structures in the surface of a solid or polymer material known as the backplate. The surface pits serve to trap small pockets of air when a thin metallized polymer film is placed overtop. The polymer film serves as the active element of the device i.e., generating and receiving ultrasound through vibration. In generation, a time-varying voltage V(t) is applied across the thin polymer film, grounding the outer metallized surface of the polymer film while applying V(t) to the backplate (whose surface is made conducting). This time-varying voltage (often superimposed upon a dc bias voltage), creates a time-varying electric field that drives the grounded surface of the thin film into vibration via electrostatic forces. In detection, ultrasonic waves arriving at the thin film drive the thin membrane into motion which, in the presence of an applied bias voltage across the backplate and thin-film, generates charge variations Q(t) that can be detected by charge-sensitive (or trans-impedance) amplification schemes.

Essentially, the structure is much like a large array of tiny drum-skins all vibrating in unison, with the frequency bandwidth of the transducer going up with decreasing dimensions of the backplate pits and with decreasing thickness of the thin film. In order to get high frequency responses, wide bandwidths, and high sensitivities, these earlier patents taught that it was necessary to turn away from conventional means of roughening the backplates (e.g., sanding, sandblasting, etc.) toward a more careful control over pit shapes and pit sizes using micromachining manufacturing techniques. A number of other patents have since issued with variations on this general theme, most of which employ a silicon-nitride solid membrane.

Four main problems have often appeared in implementing the micromachined approach during transducer manufacture for various markets.

First, it has often been prohibitively expensive for small companies to use micromachining techniques to prototype and run R&D efforts on new transducers. The high expense of micromachining results mainly from the need to make various photolithographic masks, etc. for the processing of micromachined structures, but also because the IC/micromachining industry is set up to serve mass-markets through the mass-production of devices (i.e., as with transistors). Basically, the set-up costs are typically high with micromachining, though the per-unit costs can be low at high volume. Naturally not all markets are large enough to justify high numbers of units and therefore a less expensive means of fabricating capacitive ultrasonic transducers for use in fluids (i.e., gas and liquids) would be advantageous for satisfying a wider variety is of markets.

The second problem has been that not all markets and applications for capacitive transducers actually require the highest-bandwidths that result from the micromachining of transducers. This leads to unnecessary expenses for micromachining of transducers, when a less-involved fabrication method capable of providing somewhat reduced, though still sufficient, acoustic performance would suffice.

The third problem has resulted from attempts to create roughened backplates having 3-dimensional top surfaces (e.g., spherical) so as to gain control over resultant ultrasonic field shapes and so create such devices as focussed transducers. Such transducers with 3-dimensional top surfaces are not easily created via micromachining techniques at present, because the IC/micromachining industry has been developed predominantly for use on planar 2-dimensional surfaces (such as integrated circuits). Thus, the provision of a method that would allow an ease of integrating 3-dimensional or curved backplate elements would be particularly advantageous (regardless of whether those elements are created by micromachining or conventional means).

The final problem has been that, regardless of whether micromachining or other methods are employed for the creation of backplates, careful attention must be directed toward: (a) effective electromagnetic shielding and packaging issues for the backplates; and (b) an ease of integration with associated discrete electronics (both through-hole, and Surface Mount Technology or SMT). Shielding and packaging issues are of particular concern when mounting numerous backplates within a single housing (e.g., as in the creation of multi-element capacitive transducers), but also when the total volume (or size) of a transducer assembly is a concern, as it often is for various markets. Thus, it would be a significant advance to provide a more convenient fabrication method, if that method were to ease the effective electromagnetic shielding, packaging and electronic integration of capacitive ultrasound transducers.

SUMMARY OF THE INVENTION

The above problems have all been overcome by manufacturing capacitive-type gas- and liquid-coupled ultrasound transducers using the same techniques used to create and pattern printed circuit boards (or PCB's).

According to one aspect of the invention there is provided a method of producing an ultrasonic transducer assembly. The method comprises the steps of creating a multi-layered printed circuit board, having a top surface and bottom surface; creating a patterned conducting layer upon each of the top and bottom surface; creating at least one patterned backplate electrode on the board; creating at least one conductive via integral with the board; roughening at least a portion of each of the at least one backplate to introduce gas pockets in that portion of a surface of the backplate; and attaching a thin insulating or dielectric film on a portion of the board in which the film has an integral conducting surface and in which the conducting surface is configured so as to form a capacitive structure with the at least one backplate.

In accordance with another aspect of the invention there is provided a further method of producing an ultrasonic transducer assembly. The method comprises the steps of creating a multi-layered printed circuit board, having a top surface and bottom surface; creating a patterned conducting layer upon each of the top and bottom surfaces; creating at least one discreet component, each of which components comprises at least one backplate electrode; roughening at least a portion of each of the at least one backplate; attaching the component to the board; creating at least one conductive via integral with the board; and attaching thin insulating or dielectric film on a portion of the board in which the film has an integral conducting surface and in which the conducting surface is configured so as to form a capacitive structure with the backplate.

In accordance with another aspect of the invention there is provided an ultrasonic transducer assembly comprising a multi-layer printed circuit board having a top and bottom surface in which the board can be rigid or flexible. There is a patterned conducting layer on each of the top and bottom surfaces and at least one conductive via integral with the board. The assembly further comprises at least one patterned backplate electrode, roughened on a portion of a surface to create gas pockets in the backplate; and an insulating film attached on a portion of the board, in which the film has an integral conducting surface configured so as to form a capacitive structure with the backplate.

By following the methods of the present invention, the cost of prototyping unique and/or one-off transducers has proven to be very low and simple to implement (compared with micromachining approaches). Also, the performance of such PCB transducers (e.g., with conventionally roughened backplates) exhibit bandwidths of ~1 MHz, which is more than adequate for various lower volume and/or less-demanding markets. Moreover, production of capacitance transducers via this PCB approach has proven comparatively inexpensive in small numbers using standard PCB-production facilities, yet allows an ease and flexibility in design via widely-accessible PCB layout software.

BRIEF DESCRIPTION OF THE DRAWINGS

These and other advantages of the invention will become apparent upon reading the following detailed description and upon referring to the drawings in which.

Figure 3:
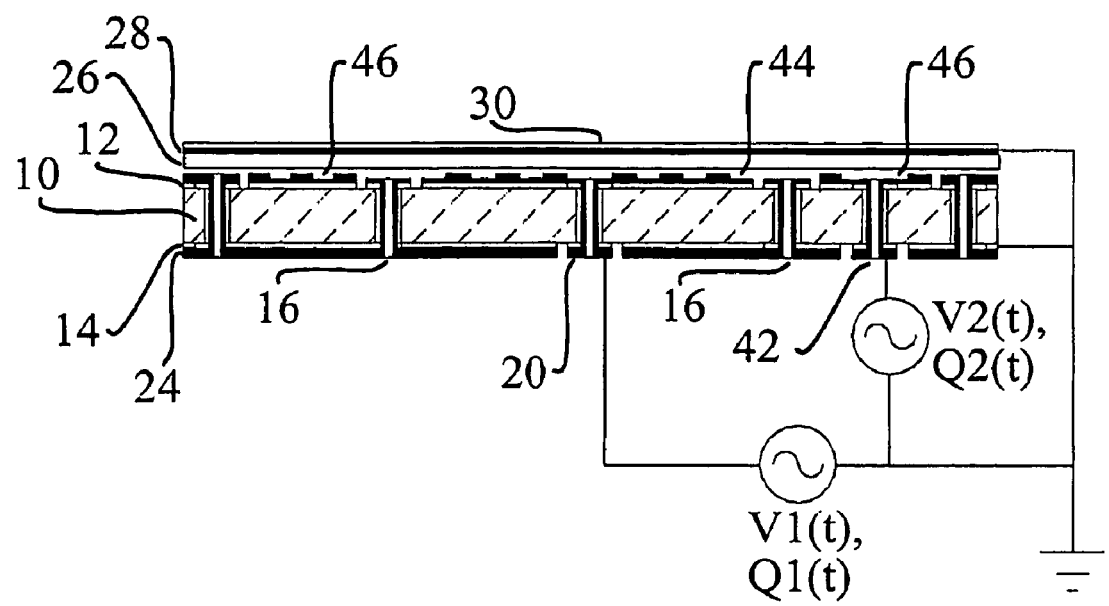
FIG. 3 is a sectional view of a PCB transducer assembly manufactured following an alternate embodiment of the present invention.

While the invention will be described in conjunction with the illustrated embodiments described above, it will be understood that it is not intended to limit the invention to such embodiments. On the contrary, the invention is intended to cover all alternatives, modifications and equivalents as may be included within the spirit and scope of the invention as defined by the appended claims.

DETAILED DESCRIPTION OF THE PREFERRED EMBODIMENTS

In the following description, similar features in the drawings have been given similar reference numerals.

Figure 1:
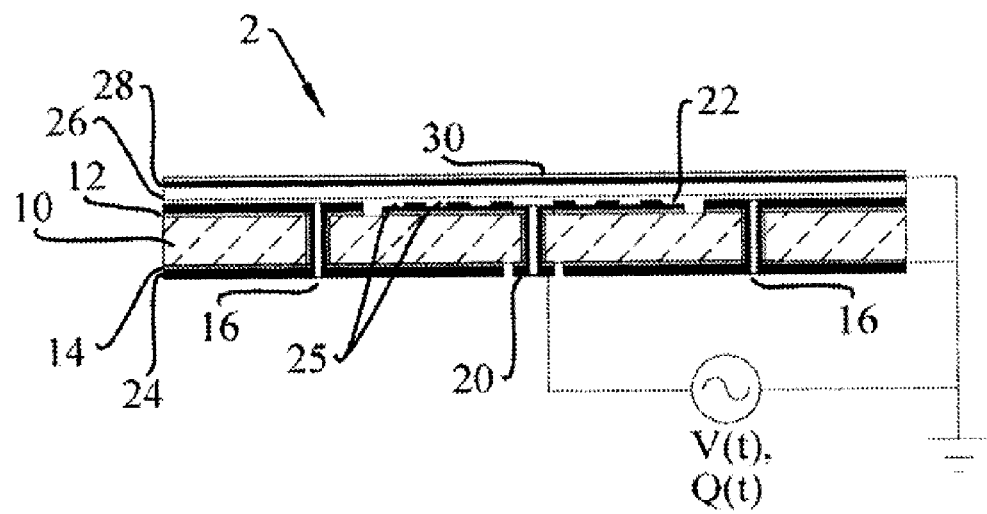
FIG. 1 is a sectional view of an ultrasonic printed circuit board transducer assembly manufactured following one possible embodiment of the present invention.

FIG. 1 illustrates an ultrasonic transducer assembly 2, manufactured in accordance with one aspect of this invention, shown in cross-section. Standard PCB manufacturing processes are used to create a patterned conducting layer (often made of copper) upon both the top 12 and bottom 14 of an electrically-insulating PCB 10 (often made of a fibrous composite material). Such PCB's can be rigid or flexible and manufactured according to known techniques. For manufacture of flexible PCB's reference may be had to techniques similar to those used in 3M's Microflex Circuits™ or other flexible circuit design technology. These techniques would be suited to construct transducer assemblies within the meaning of the present invention.

Figure 2A:
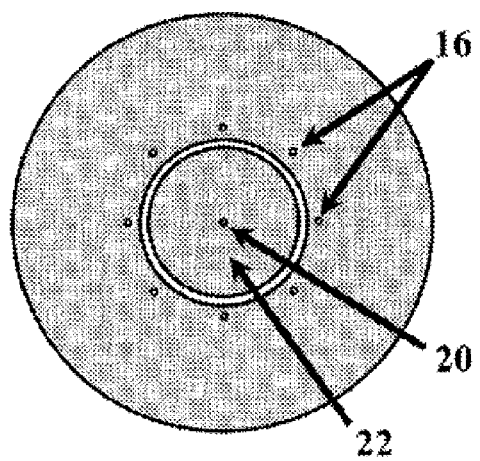
FIG. 2a is a top view of the ultrasonic PCB transducer of FIG. 1.
Figure 2B:
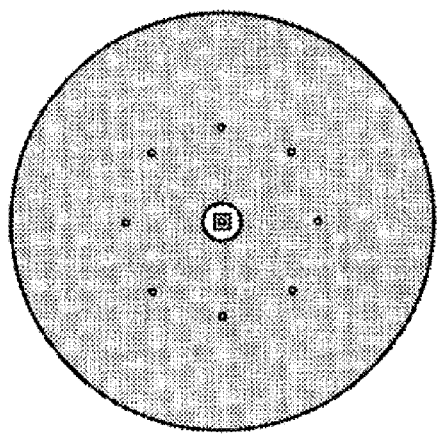
FIG. 2b is a bottom view of the ultrasonic PCB transducer of FIG. 1.
Figure 3:
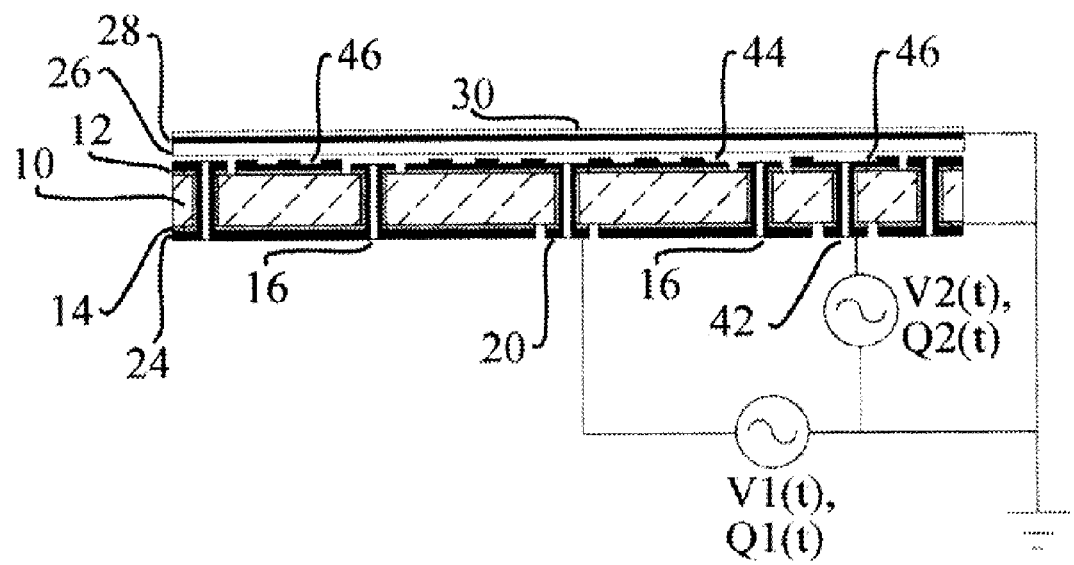

Through-hole vias 16, 20, which are used to connect top-side patterned conductors with bottom-side patterned conductors, are created by first drilling small holes through the PCB 10 and then electroplating the side-walls with further conducting material, as is standard in PCB fabrication. The plated vias 16 in particular, in conjunction with many more like them distributed for example in a circle (see FIG. 2), can optionally serve to connect top-side groundplanes with bottom-side ground planes thus encasing the backplate electrode 22 about its sides and bottom within an electrical ground-shield resembling a form of Faraday cage. Such encasement by a Faraday cage serves to contain the electric fields generated in the space surrounding the backplate 22: (a) when a voltage V(t) is applied to the backplate 22 for generation of ultrasound; and (b) when charge variations Q(t) are generated on the backplate 22 upon detection of arriving ultrasound.

Although not illustrated in the configuration shown in FIG. 1, backplate 22 can be constructed on the top or bottom or on both surfaces of the board. Indeed, any number of backplates 22 can be constructed on a board, and any number of those backplates can be electrically encased in their own Faraday cages.

Such shielding by a Faraday cage has been shown to be very effective and it is expected that the effectiveness increases as the number and density of ground-vias 16 increases and as the thickness of the PCB 10 decreases. Such a Faraday cage can also serve: (i) to reduce the sensitivity to pickup of ambient electromagnetic noise (when the transducer is operating as an ultrasonic detector); and (ii) to reduce radiated electromagnetic radiation from the transducer (when the device is operating as an ultrasonic source).

Optional addition of a patterned solder layer 24 within the transducer assembly 2 of FIG. 1 is standard in PCB fabrication and can facilitate by reflow-soldering (or heating) techniques: (a) the installation of various electronic and/or acoustical components to either side of the PCB transducer assembly 2; (b) the fixing of the entire PCB transducer assembly 2 of FIG. 1 to other PCB's populated with processing electronics (not shown); and (c) the fixing of the entire PCB transducer assembly 2 to various transducer housing configurations (separately prepared) for the production of stand-alone ultrasonic transducers. Furthermore, various other material layers (not shown in FIG. 1), which are also standard within the PCB production process, can similarly be included if the designer so requires, including insulating varnish masks, patterned glue deposition, and component designation/location labels, etc. Such versatility in design is another important aspect of the invention, since the designer can easily create an enormous variety of material layers and patterns using readily-available and user-friendly PCB layout software, with designs simply being sent off for manufacture (often electronically) to any of the countless PCB fabrication facilities currently operating in the industry.

Once the PCB backplate 22 (and shield structure if used) of FIG. 1 have been created, at least a portion of the surface of the backplate electrode 22 must then be roughened in order to introduce tiny pockets 25 of gas, which gas can be air or gas at any pressure, for acoustic operation in this type of capacitive ultrasonic transducer 2. Roughening of the backplate 22, or of any number of backplates, can occur by a wide variety of techniques, including but not limited to: mechanical roughening and machining (e.g., sanding, sandblasting, milling, turning); electrochemical etching and/or selective plating; laser-machining; and plasma sputtering. Microfabrication techniques can also be used for roughening backplates, with preferred methods including but not limited to those taught by Madou in "Fundamentals of Microfabrication," 1997.

If a solder layer 24 is used upon the backplate 22, then any such roughening techniques must also occur in the solder layer 24 following the completion of any reflow soldering steps, else the roughening may be removed by reflow. If, on the other hand, no solder layer 24 is employed on the backplate 22, then the roughening techniques may be directly applied to the conducting layer 12 so as to create the necessary gas pockets 25.

With the PCB backplate 22 now roughened, this form of ultrasound transducer 2 requires that a thin insulating or dielectric film 26 having an integral conducting top surface 28 be attached upon the top of the assembly. Such attachment can be by superimposing the film, connecting or by any other suitable means known in the art. Such a film 26 is placed upon and typically in contact with the top surface 12 of the PCB transducer assembly 2, with its top conducting surface 28 typically being grounded, so as to form a capacitive structure with the backplate 22. This thin film 26 serves as both the active component of the transducer (i.e., generating and receiving ultrasound through its vibration), and to complete the ground cage shielding structure over the top surface of the transducer.

The upper conductor 28 can be created by any convenient means necessary, such as evaporation or sputtering, and in practice is usually connected electrically to the ground planes of the PCB assembly 2 (as shown) using any suitable means including but not limited to wire-bonding, soldering, gluing with conducting epoxies, simple mechanical pressure contacts applied by mechanical housing components, etc. Though the embodiment illustrated in FIG. 1 illustrates use of an insulating polymer film 26 such as Mylar™, Kapton™, Teflon™, Kynar™, polyethylene, polyimide, etc., it will be readily appreciated by those skilled in the art that any type of non-polymer material can also be used, including but not limited to silicon-nitride, aluminum oxide, mica, etc.

Furthermore, it will also be readily appreciated that the thin insulating film 26 may consist of a single layer of one material (such as commercially-available thin metallized Mylar™ films), or be made up of numerous integrated layers of different materials including a combination of polymer and non-polymer materials, where the conducting layer 28 could further be placed at any position through the thickness of the thin multi-layer film. Also, it is envisioned that any layer or combination of layers within film 26 may be permanently electrified in the form of an electret so as to provide an internal electric bias field within the transducer which can replace the need for an externally applied bias voltage superimposed upon V(t).

An additional optional layer 30 of FIG. 1 can also be integrated into the film structure on top of the upper conducting electrode. This optional layer 30, when needed, can be used to protect the upper conducting ground layer 28 and thin film 26, and the transducer as a whole, from: (i) the ingress of liquids such as water; (ii) the attack by corrosive chemicals/gases; or (iii) wear or damage due to impacting particulates and/or rubbing friction.

Though the description of FIG. 1 thus far has implied the use of standard materials currently available for processing in PCB fabrication facilities (e.g., fibrous composite for layer 10, copper for layer 12 and 14, and lead-tin solder for layer 24), it will be readily appreciated by those skilled in the art that any suitable materials can be used provided they can be made to follow a similar set of manufacturing steps (suitably altered of course to allow for the different materials). As a particular example, a glass insulator might be used for layer 10 with gold-deposition employed for layers 12 and 14, along with application of a silver-based or indium-based solder for layer 24. As another example, one might opt for injection molding of the part and then follow this with selective coating and/or plating of the various conductors and vias, etc. Yet another example widens the notion of the vias beyond the drilling and plating steps mentioned thus far, since any conducting path through the board will suffice as a via such as diffusion or thermomigration of conducting channels through silicon, backfilling of drilled holes within a board using a conducting material, etc.

FIG. 1 also illustrates the use of a two-layer PCB layout. However, the use of multi-layer PCB's (also standard in the industry) would provide an even greater variety for signal routing and shielding schemes beyond the specific 2-layer board depicted in FIG. 1. The use of multi-layer PCB's of any convenient number of layers, any of which can be individually patterned, is therefore envisioned useful and so is included within the scope of the present invention.

A useful result of the invention is that containment of electric fields by PCB ground cages allows many backplates to be conveniently placed in close-proximity to one another, and within the same device, while at the same time minimizing electrical cross-coupling (or cross-talk) between backplates. Indeed, by shielding each and every backplate 22 within its own PCB Faraday cage, the creation of capacitive transducer arrays and multi-element devices of almost any imaginable shape and function becomes possible upon a single PCB 10. This capability is exemplified in FIGS. 3 and 4, where the PCB fabrication process has now been extended to include a second backplate 40 illustrated in FIG. 4 in the form of an annulus that surrounds the central disk-shaped backplate 22. The two backplates are in general each provided with their own signal via 20 and 42 so as to allow: (i) separate voltages V1(t) and V2(t) to be applied for individual control over generated ultrasound by the two elements of the transducer; or (ii) to allow separate charge-variations Q1(t) and Q2(t) to be detected by the two backplates upon reception of ultrasound. The two backplates 22,

40 can even be provided with different surface roughnesses 44, 46, if desired, so as to provide differing acoustic performance of the two elements of the transducer assembly. Note that containment of electric fields of the two backplate elements 22, 40 has been provided by connecting a thin circular ground ring 48 between the two elements to the backside ground plane using an array of ground vias 16. Completion of the ground cages on the tops of the backplates 22, 40 can be accomplished, for example, using a common thin-film 26 with grounded upper surface 28 for both transducer elements.

Figure 4A:
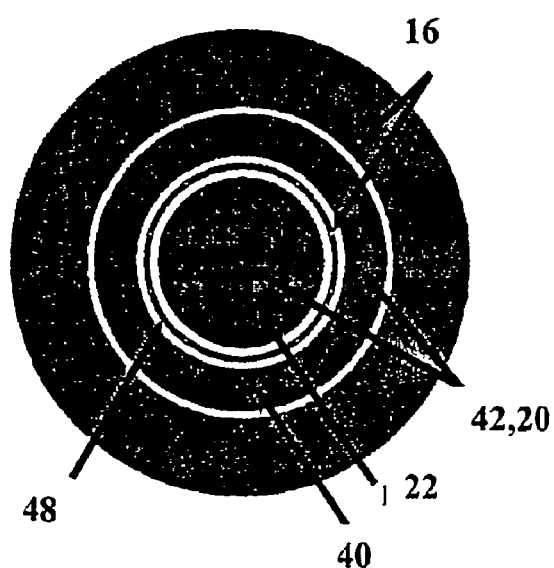
FIG. 4a is a top view of the PCB transducer of FIG. 3.
Figure 4B:
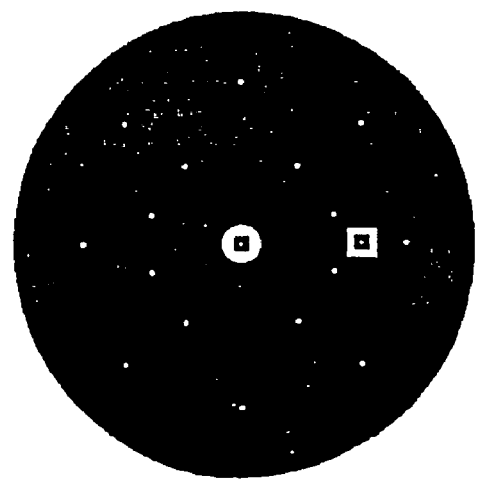
FIG. 4b is a bottom view of the PCB transducer of FIG. 3.
Figures 4A, 4B:
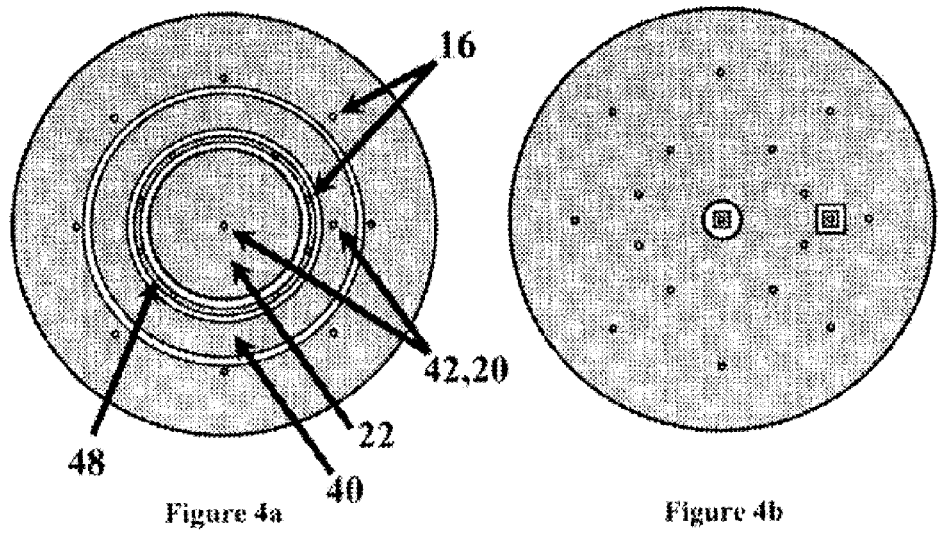
Figure 5:
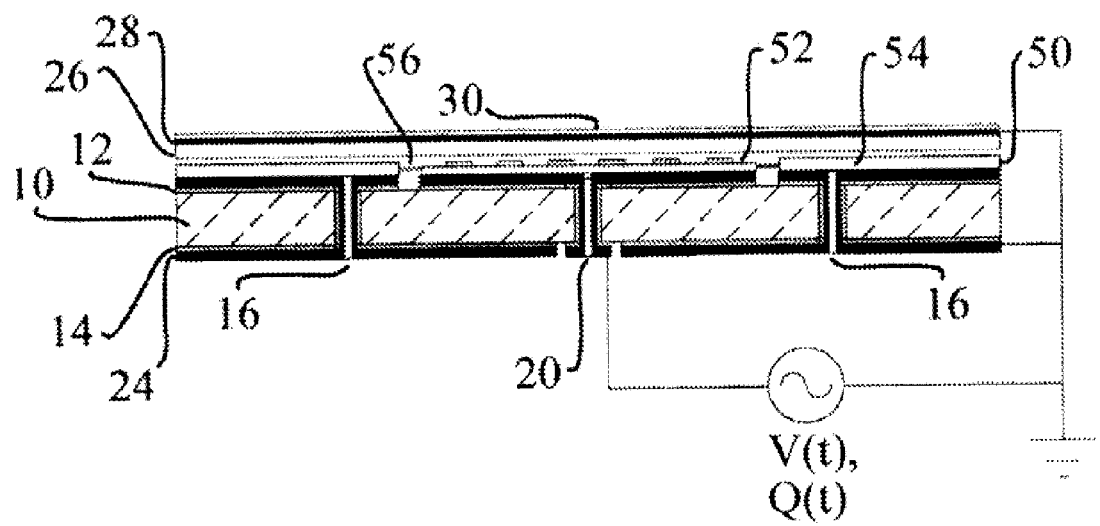
Figure 6:
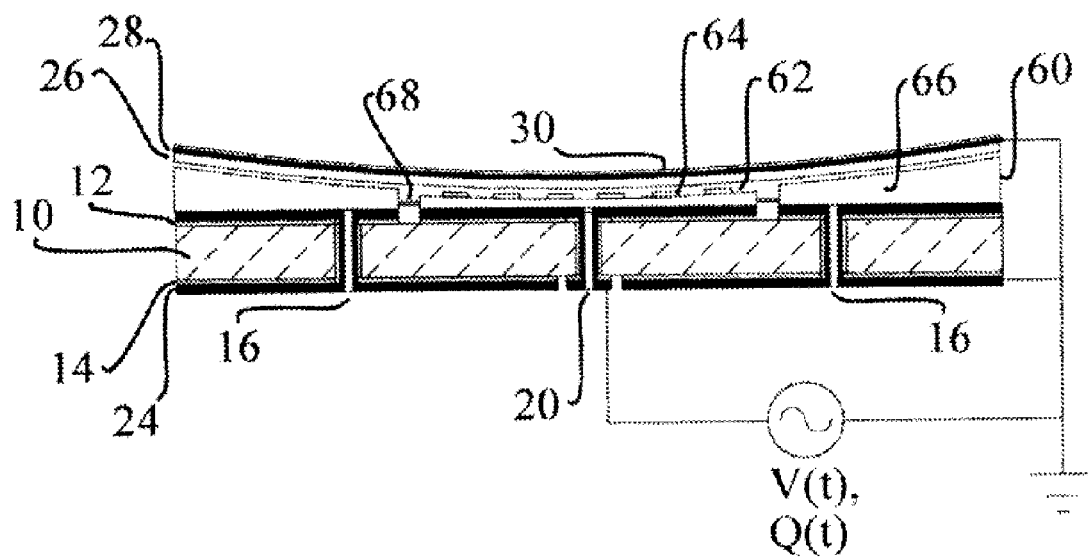
Figure 7:
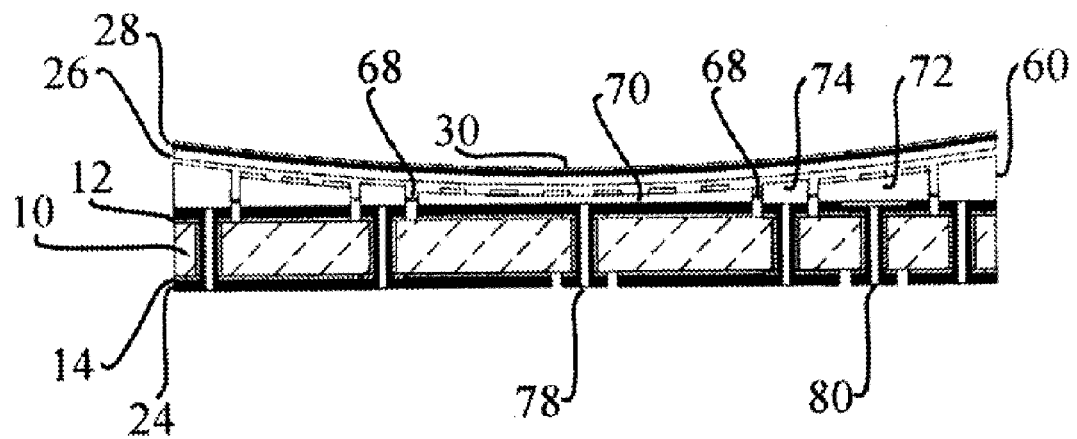
Figure 8:
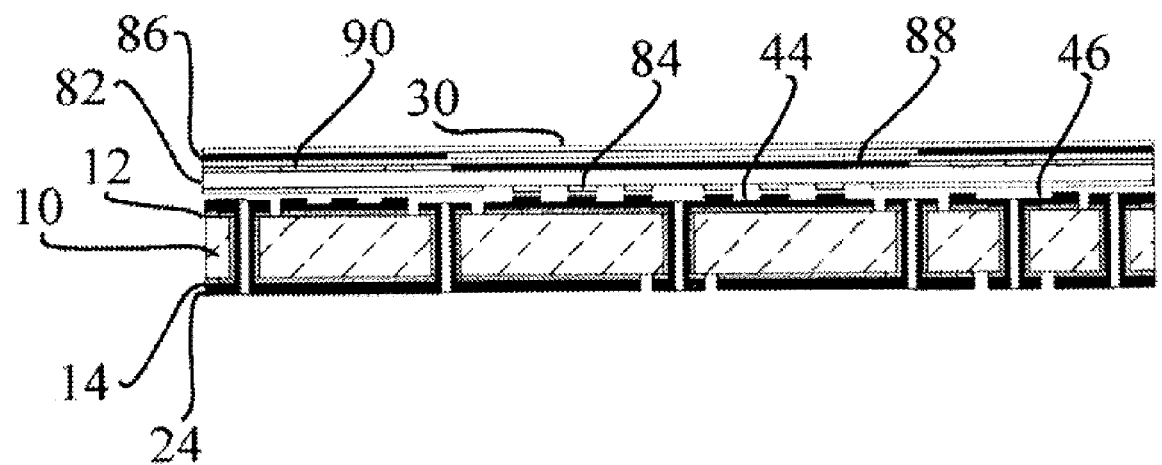

Devices like that shown in FIGS. 3 and 4 have been used with effect to: (a) generate different ultrasonic wave shapes from the two elements, such as different ultrasonic frequencies; and (b) to receive on one of the elements while generating ultrasound on the other, thus creating a two-element pulse-echo transducer. In such cases, electrical cross-talk has been minimized by the use of PCB groundcages, an effect which has proven difficult to achieve in such capacitance transducers by other manufacturing techniques explored over the years. Such effective shielding is easy to obtain using widely-accessible PCB layout software and available PCB fabrication facilities, such that the invention provides significant advantages both in improving and simplifying the fabrication of well-shielded multi-element capacitance transducers.

Though the particular example of FIG. 3 and 4 describes two backplate elements with surrounding PCB ground cages, it should be appreciated that the process is easily extended to include any number and shape of independent backplates and ground cages configured upon the top or bottom or both top and bottom surfaces.

Figure 5:
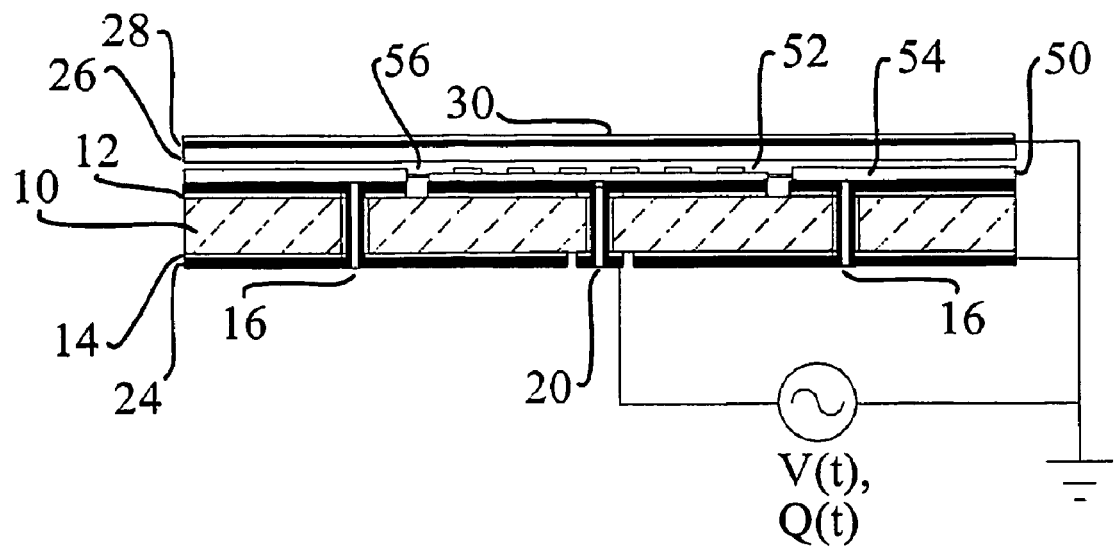
FIG. 5 is a sectional view of a PCB transducer assembly manufactured following an alternate possible embodiment of the present invention.

By an alternate aspect of the invention, direct roughening of layer 12 or 24 to form the backplate 22 is avoided, as shown in FIG. 5. Instead, an additional discreet component 50 is manufactured in such a way that it can act both as a roughened backplate 52 (in the regions where a roughened backplate is required) and as a spacer 54 if needed (in the regions where ground planes exist). The main advantage of doing this is that far greater versatility is provided in the manufacture of component 50 (compared with the embodiment of FIG. 1) since a wider array of backplate materials and processing techniques can now be employed to create component 50. For example, all of the same means highlighted above for providing roughness to backplate 22 of FIG. 1 can again be used here to provide roughness to backplate 52 of part 50. However, the freedom to use a plethora of micromachining or microfabrication techniques to roughen 52 now also exists (e.g., by the methods described in "Fundamentals of Microfabrication" by Madou, 1997), thus providing an effective means to shield and connect micromachined backplates, which has been a need for some time. The only real restriction placed upon component 50 is that at least its surface (or some layer near to or beneath the surface) must be made electrically conducting, thus requiring that either a conducting material be used from the outset to create component 50, or that it be made conducting after creation by any standard methods for doing so (e.g., electroplating, evaporative techniques, plasma-deposition, and so on). Of particular interest would be the possibility of replicating component 50, along with its surface roughness for backplate portion 52, using injection molding or micro-embossing techniques followed by plating/electroplating and/or deposition of conducting material onto its surfaces.

In terms of integrating component 50 into the assembly process, note that if the bottom surface of component 50 is made conducting using a suitable material of choice, then it can also have a solder layer applied (for example, by "tinning"). Such a solder layer then allows attachment to the underlying PCB 10 through simple reflow soldering techniques at elevated temperature. Alternatively, component 50 could be attached in other ways also, such as with heat-activated conducting adhesives, UV-activated conducting adhesives, wire bonding, and so on. Any process that allows rigid attachment of component 50 to the PCB 10 beneath is sufficient, provided it provides appropriate electrical connection of the two components in the needed areas.

After attaching component 50 to the PCB 10, the spacer 54 and backplate 52 elements of component 50 must be electrically isolated from one another in the case that they were manufactured together. One way of doing this is to manufacture component 50 with small frangible connecting tabs 56 between the spacer 54 and backplate 52 elements, such that isolation may be readily accomplished at any time by breaking the small tabs 56 using a variety of means not limited to milling, laser-machining, chemical etching, or simple mechanical pressure with a sharp knife or point.

Though the particular example of FIG. 5 shows a single backplate element with surrounding PCB ground cage, it should be appreciated that component 50 can be easily extended to include any number and shape of backplates and ground cages for incorporation into multi-element transducers and arrays, as describe in reference to FIG. 4. Further, any number of components, each with its own number of backplates can be incorporated into a single transducer assembly, any of which can be placed upon either side or both sides of the board.

Figure 6:
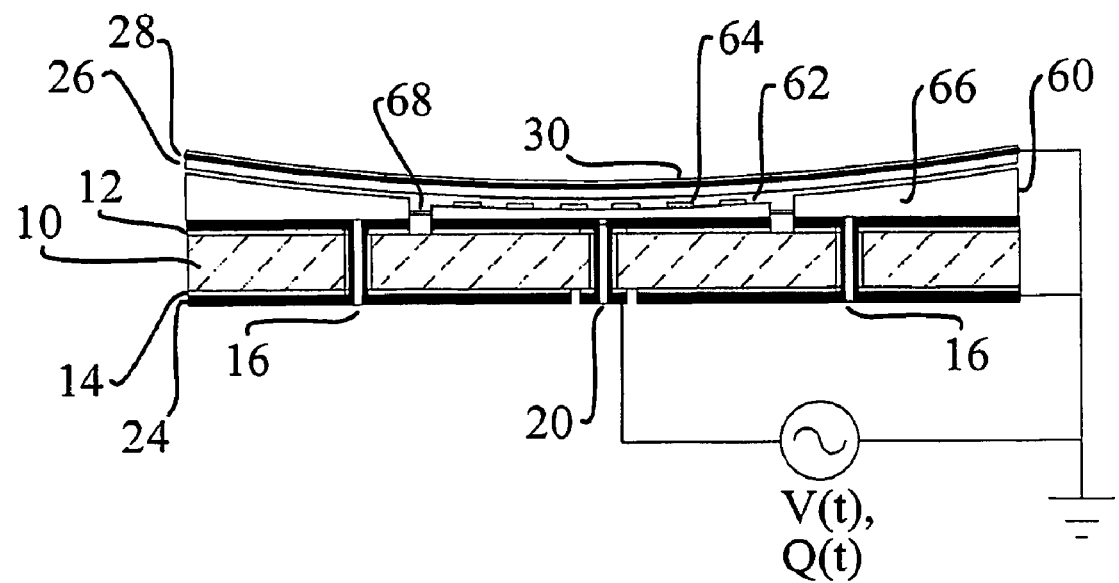
FIG. 6 is a sectional view of a PCB transducer assembly manufactured following an alternate possible embodiment of the present invention.

The freedom provided by the addition of component 50 also leads directly to another important aspect of the invention, namely the ability to incorporate 3-dimensional curved backplate elements 60. This is shown in FIG. 6, where the planar 2-dimensional component 50 of FIG. 5 is here replaced by a similar three-dimensional component 60 attached to the underlying PCB by the same techniques discussed above for attaching component 50. Such addition of a curved (as illustrated) or otherwise three-dimensional backplate structure allows for the creation of various ultrasonic field shapes not readily created for capacitive-type transducers by other manufacturing techniques. In the particular example of FIG. 6, the spherically concave surface will create a focussed radiation pattern, such that emission and reception of ultrasonic waves become sensitive to a single region or point in the ultrasonic field. Those skilled in the art will readily appreciate that not only can a spherical surface be created upon component 60, but that any 3-dimensional structure can in principle be created and attached to the PCB 10 to create a wide variety of ultrasonic radiation patterns of interest.

The upper surface of the backplate portion 62 of component 60 must still be roughened, as shown at 64 in order to provide optimal ultrasonic performance. This may be accomplished using any of the above-mentioned conventional or microfabrication techniques for roughening backplates, but may also additionally employ any 3-dimensional micromachining or microfabrication techniques that may be conceived, such as: (i) the patterning and etching of 3-dimensional surfaces using 3-dimensional photolithography, wet-chemical etching, plasma-etching, etc.; (ii) selective patterning and machining of 3-dimensional surfaces by laser-machining techniques, where the surface to be machined could for example be mounted upon carefully-controlled gimbal mounts; and (iii) 3-dimensional patterning and selective plating or electroplating by such techniques as LIGA. All that is required in the end is some means to create a roughened pattern 64 upon a 3-dimensional backplate surface for inclusion within the PCB-transducer manufacturing framework.

Following creation of the 3-dimensional backplate 62 and spacer structure 66, the small integrated frangible connecting tabs 68 are again removed to allow the backplate and spacers to be isolated electrically. Subsequent preparation of the thin-insulating film 26 and upper conductor 28 can then be accomplished by a variety of techniques including but not limited to: (i) mechanical stretching of a 2-dimensional film (with or without the application of heat); (ii) vacuum stretching of a 2-dimensional film along with the application of heat; and (iii) direct creation of a 3-dimensional film having the same dimensional (shape) characteristics of the underlying backplate.

Figure 7:
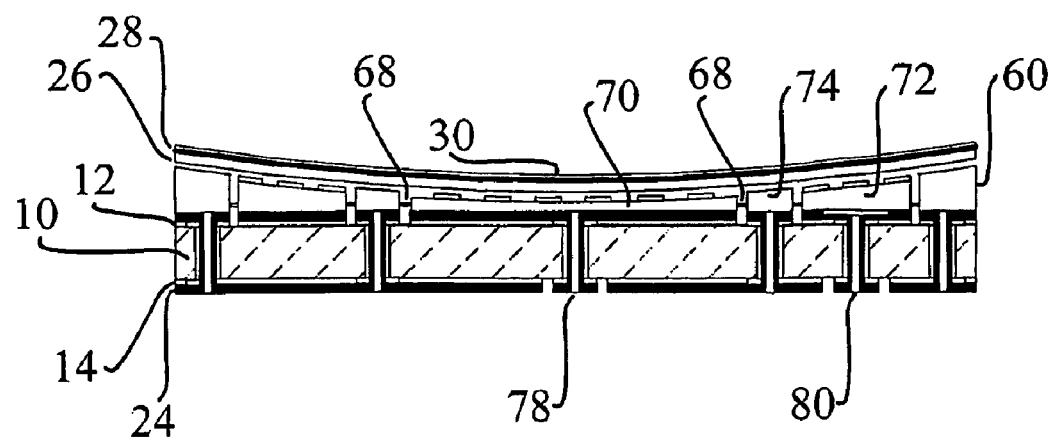
FIG. 7 is a sectional view of a PCB transducer assembly manufactured following an alternate possible embodiment of the present invention.

Though the particular example of FIG. 6 shows a single curved backplate element 62 with surrounding PCB ground cage, it should be appreciated that component 60 can be easily extended to include any number and shape of curved backplates with ground cages for incorporation into multi-element transducers and arrays on either or both sides of the board. A particular example of how this can be done is illustrated in FIG. 7, where the dual-element PCB component used earlier in FIG. 3 is again reproduced here. In this case, however, component 60 is now provided with a spherically-shaped upper surface spanning two backplate elements (one a central disk 70 and the other a surrounding annulus 72). The curved disk and annulus backplates are seen to be separated by an intervening shielding ground ring 74 that is fabricated in an integral fashion along with the backplates of component 60. As before, the intervening ground ring can be separated from the backplates using the small frangible tabs 68 shown, following connection of component 60 to the underlying PCB using, as one example, reflow soldering in a furnace. Note that each of the two backplates 70, 72 can be independently driven using the two isolated signal vias 78, 80 provided and can even be provided with different surface roughnesses to allow differing acoustic performance. Such a transducer is known as a confocal transducer, since each of the two backplate elements 70, 72 have the same focal point and so tend to focus ultrasound to the same point in space in front of the transducer. Such confocal transducers have already been assembled and successfully demonstrated using the PCB fabrication method provided by this invention.

Figure 8:
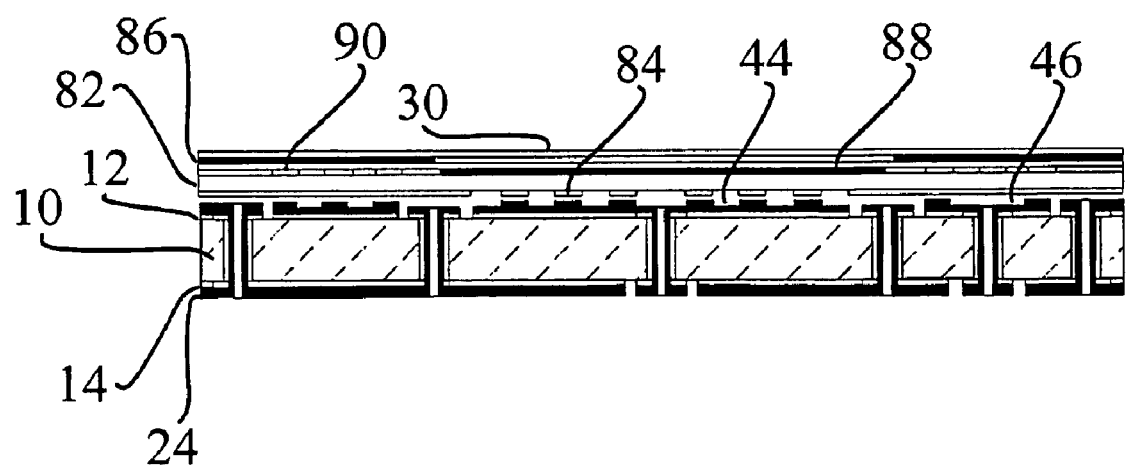
FIG. 8 is a sectional view of a PCB transducer assembly manufactured following an alternate possible embodiment of the present invention.

Further mention should be made regarding the variety of thin films envisioned as applicable in all conceivable forms of PCB ultrasound transducer assemblies. Thus far, the thin film has been shown in all figures as a simple structure involving a metallization layer 28 upon a single film layer 26, with the possible addition of a protective layer 30 upon its upper surface. In practice, however, the film can be far more complicated than this. Examples of the envisioned complexity are to be seen in the schematic diagram of FIG. 8, which employs the exact same PCB backplate structure 44, 46 as described in FIG. 3. Here, a multi-layer thin film 82 is shown which could be created by a variety of methods including but not limited to spin-caste & sol-gel processes, plasma deposition, evaporation, wet-chemical and plasma etching, electroplating, etc, (see "Fundamentals of Microfabrication" by Madou (1997) for more examples of typical manufacturing methods). Instead of creating pits only in the surfaces of solid backplates 44,46, patterning and selective removal of the thin film layers is possible so as to introduce additional gas-pockets either at the interface 84 between film 82 and backplates 44,46 or gas-pockets 90 within the multi-layer thin-film 82. Such addition of gas-pockets within and upon film 82 could be used to adjust the frequency response and/or sensitivity in various regions of the transducer (termed "apodization" of a transducer). No longer is it necessary to employ a single common ground plane either, as it would certainly be possible to separate the ground plane into two or more sections 86 and 88. One reason for doing this would be to place the ground planes of the thin-film at different distances from the conducting backplates, thus tailoring electric field strengths (and thus sensitivities) for the various elements.

Any single layer in the multi-layer film structure could additionally be permanently charged in the form of an electret so as to adjust or eliminate the need for an external bias field. Such electret layers could include though not be limited to silicon dioxide, aluminum oxide, Teflon™, polyimide, polyethylene or Mylar™, etc. As mentioned earlier, any combination of solid, flexible, conducting, or insulating layers can be used to make up the integrated film structure. Also, such multi-layer integrated films can obviously be included either with 2-dimensional planar backplates, or in concert with the 3-dimensional curved backplate structures like those shown earlier in FIGS. 6 and 7, while all such films can be placed either in direct contact with the backplates or suspended by suitable means a short distance away from the backplates (as is shown in all figures). Clearly, a great deal of variety and possibility exists.

It can be seen by the examples provided that the use of PCB's for the manufacture of capacitive/electrostatic type transducers allows the following benefits:

1) electric fields can be contained in single-element devices through the use of plated through-hole vias connecting ground planes upon the PCB's top and bottom surfaces
2) effective shielding of electric fields (and thus isolation of elements in multi-element devices) is possible using conductive vias connecting ground planes upon the PCB's top & bottom surfaces
3) inexpensive yet flexible manufacture for lower-bandwidth transducers
4) transducers not readily possible by micromachining due to high expense, can be more easily prototyped and developed
5) simple thermal assembly techniques are available via thermal reflow soldering for the attachment of electrical connectors, electronic components, acoustical components, etc. Basically, the entire assembly (or any portion of the assembly) can be connected together by employing a furnace and heating to join the various solder layers, provided suitable mechanical jigs are provided for holding relative positions of parts during heating
6) electronics (both thru-hole and SMT) can be provided on the same PCB as transducers, or vise-versa, allowing inexpensive integration of sensors with electronic for various markets
7) transducer backplates can be defined directly on the copper and/or solder surfaces by roughening via a variety of etching or mechanical roughening techniques (sandblasting, sanding, machining, etc.)
8) micromachined backplates can also be affixed to the PCB by thermal processing of the solder layer, allowing a wide array of high-quality shielding and connection technologies while maintaining the higher bandwidth and performance of micromachined backplates
9) curved backplates, whether machined conventionally or by future 3-d micromachining techniques, can be mounted upon PCBs to allow for focussed devices and other ultrasonic radiation profiles 10) Flexible (or bendable) transducer assemblies become possible via various flexible circuit board technologies.

11) connections between various elements and components can be effected by reflow of the solder layers, or perhaps by various conducting epoxies, etc.

12) both gas and liquid-coupled capacitive transducers can be manufactured by this approach 13) the technique may be more-widely applicable for the shielding and patterning of connections & signal lines in all types of ultrasonic transducers 14) upper thin-film electrode components including integrated apertures might also be attached using thermal reflow soldering and other techniques 15) capacitance transducers can be made smaller and more compact, particularly in the thickness direction, but also in the transverse direction through the use of high-density coaxial connectors readily-available in the electronics industry.

Thus, it is apparent that there has been provided in accordance with the invention an ultrasonic printed circuit board transducer assembly and methods of manufacture that fully satisfy the objects, aims and advantages set forth above. While the invention has been described in conjunction with illustrated embodiments thereof, it is evident that many alternatives, modifications, combinations and variations will be apparent to those skilled in the art in light of the foregoing description. Accordingly, it is intended to embrace all such alternatives, modifications and variations as fall within the spirit and broad scope of the invention.

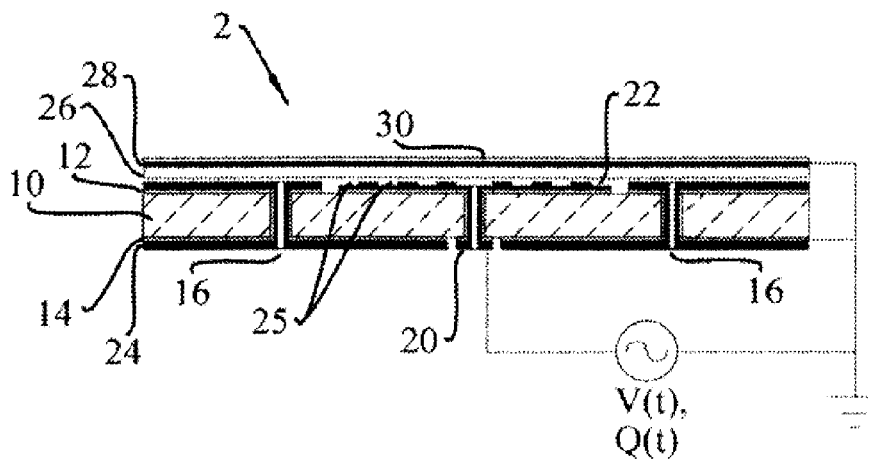

I claim:

1. A method of producing an ultrasonic transducer assembly, said method comprising the steps of:
    creating a multi-layered printed circuit board, having a top surface and bottom surface, wherein one or more of said layers of said board are individually patterned;
    creating at least one patterned backplate electrode on said board;
    creating at least one conductive signal via integral with said board;
    creating a plurality of encasement vias integral with said board, said encasement vias serving to connect ground planes on the sides of said at least one backplate with ground planes beneath said at least one backplate;
    roughening at least a portion of each of said at least one backplate to introduce gas pockets in said portion of a surface of said at least one backplate;
    attaching thin insulating or dielectric film on a portion of said board, said film having an integral conducting surface, said conducting surface grounded so as to form a capacitive structure with said at least one backplate and to complete encasement of said at least one backplate, said encasement serving to contain electric fields generated in a space surrounding said at least one backplate during use.

2. The method of claim 1 further comprising the step of adding a protective layer integrated with said film.

3. The method of claim 1 further comprising the step of adding a patterned solder layer to said board within said assembly.

4. The method of claim 3 further comprising the step of installing electrical, electronic, mechanical and/or acoustical elements to either or both of said top or bottom surface of said board.

5. The method of claim 3 wherein said patterned solder layer is roughened by a process selected from the group consisting of mechanical roughening, machining, microfabrication, sanding, sandblasting, milling, turning, electro-chemical etching, selective plating, laser-machining and plasma sputtering.

6. The method of claim 1 wherein said vias are created by drilling a plurality of holes distributed about said board and subsequently electroplating side-walls of said drilled holes.

7. The method of claim 1 wherein said roughening is by a process selected from the group consisting of mechanical roughening, machining, microfabrication, sanding, sandblasting, milling, turning, electro-chemical etching, selective plating, laser-machining and plasma sputtering.

8. The method of claim 1 wherein said film is created using spin-cast methods, sol-gel processes, plasma deposition, sputtering, evaporation or electroplating.

9. The method of claim 1 wherein said film is connected electrically to ground planes on said top and bottom conducting layers by means of a process selected from the group consisting of wire-bonding, soldering, gluing with a conducting epoxy and mechanical pressure contacts applied by mechanical housing components.

10. The method of claim 1 wherein said film is constructed of an insulating film selected from the group consisting of Mylar, Kapton, Teflon, Kynar, polyethylene, polyimide, mica, silicon-nitride and aluminum oxide.

11. The method of claim 1 wherein a portion of said film is permanently electrified in the form of an electret so as to provide an internal electric bias field within said assembly.

12. The method of claim 1 wherein said board is flexible.

13. The method of claim 1 wherein said insulating or dielectric film is multi-layered.

14. The method of claim 13 further comprising the step of patterning and selective removal of layers in said multi-layer film to introduce further gas pockets in said assembly.

15. The method of claim 1 wherein each of said at least one backplate electrode is associated with a separate signal via and is independently electrically encased.

16. The method of claim 1 wherein each of said at least one backplate electrode has separate roughening.

17. The method of claim 1 further comprising the steps of:
    creating at least one discrete component, each of said at least one discrete components comprising said at least one backplate electrode;
    roughening at least a portion of said at least one backplate electrode;
    attaching said component to said board;
    attaching said thin insulating or dielectric film on a portion of at least one of said board or at least one discrete component.

18. The method of claim 17 further comprising creating spacers on said at least one discrete component, said spacers being electrically isolated from said at least one backplate.

19. The method of claim 18 wherein said each of said at least one backplate and said spacers are electrically isolated using a plurality of frangible connecting tabs.

20. The method of claim 17 wherein said component is 2-dimensional or 3-dimensional.

21. The method of claim 17 further comprising adding a patterned solder layer to said board within said assembly.

22. The method of claim 21 wherein each of said at least one discrete components is attached to said board using reflow soldering between a solder layer on said component and said solder layer on said board.

23. The method of claim 21 further comprising the step of installing electrical, electronic, mechanical and/or acoustical elements to either or both of said top or bottom surface of said board.

24. The method of claim 21 wherein said patterned solder layer is roughened by a process selected from the group consisting of mechanical roughening, machining, microfabrication, sanding, sandblasting, milling, turning, electro-chemical etching, selective plating, laser-machining and plasma sputtering.

25. The method of claim 17 wherein said board is flexible.

26. The method of claim 17 wherein at least a portion of a surface of each of said at least one discrete components is electrically conducting.

27. The method of claim 17 wherein said component is attached to said board using a process selected from the group consisting of applying heat-activated conducting adhesives, applying UV-activated conducting adhesives and wire-bonding.

28. The method of claim 17 further comprising the step of adding a protective layer integrated with said film.

29. The method of claim 17 wherein said vias are created by drilling a plurality of holes distributed about said board and subsequently electroplating side-walls of said drilled holes.

30. The method of claim 17 wherein said roughening is by a process selected from the group consisting of mechanical roughening, machining, microfabrication, sanding, sandblasting, milling, turning, electro-chemical etching, selective plating, laser-machining and plasma sputtering.

31. The method of claim 17 wherein said film is created using spin-cast methods, sol-gel processes, plasma deposition, sputtering, evaporation or electroplating.

32. The method of claim 17 wherein said film is connected electrically to ground planes on said top and bottom conducting layers by means of a process selected from the group consisting of wire-bonding, soldering, gluing with a conducting epoxy and mechanical pressure contacts applied by mechanical housing components.

33. The method of claim 17 wherein said film is constructed of an insulating film selected from the group consisting of Mylar, Kapton, Teflon, Kynar, polyethylene, polyimide, mica, silicon-nitride and aluminum oxide.

34. The method of claim 17 wherein a portion of said film is permanently electrified in the form of an electret so as to provide an internal electric bias field within said assembly.

35. The method of claim 17 wherein said insulating or dielectric film is multi-layered.

36. The method of claim 35 further comprising the step of patterning and selective removal of layers in said multi-layer film to introduce further gas pockets in said assembly.

37. The method of claim 17 wherein each of said at least one backplate electrode is associated with a separate signal via and is independently electrically encased.

38. The method of claim 17 wherein each of said at least one backplate electrode has separate roughening.

39. The method of claim 17 wherein said board is rigid.

40. The method of claim 17 wherein each of said at least one backplate electrode is associated with the same signal via.

41. The method of claim 17 wherein each of said at least one backplate electrode has similar roughening.

42. The method of claim 1 wherein said board is rigid.

43. The method of claim 1 wherein each of said at least one backplate electrode is associated with the same signal via.

44. The method of claim 1 wherein each of said at least one backplate electrode has similar roughening.

45. An ultrasonic transducer assembly comprising;
   a multi-layer printed circuit board having a top and bottom surface, said board being rigid or flexible, wherein one or more of said layers of said board are individually patterned;
   at least one conductive signal via integral with said board;
   at least one patterned backplate electrode, roughened on at least a portion of a top surface to create gas pockets in said backplate;
   a plurality of encasement vias integral with said board, said encasement vias serving to connect ground planes on the sides of said at least one backplate with ground planes beneath said at least one backplate;
   an insulating film attached on a portion of said board, said film having an integral conducting surface grounded so as to form a capacitive structure with said backplate and to complete encasement of said at least one backplate, said encasement serving to contain electric fields generated in a space surrounding said at least one backplate in use.

46. The assembly of claim 45 wherein said at least one backplate is a part of a discrete component and wherein said insulating film is attached on a portion of at least one of said board or said at least one discrete component.

47. The assembly of claim 46 wherein said discrete component further comprises spacers.

48. The assembly of claim 46 wherein said backplate is 2-dimensional or 3-dimensional.

49. The assembly of claim 45 further comprising a protective layer integrated with said film.

50. The assembly of claim 45 wherein said insulating film is multi-layered.

51. The assembly of claim 50 wherein pits are created in said film or between said film and at least one backplate.

* * * * *

UNITED STATES PATENT AND TRADEMARK OFFICE
CERTIFICATE OF CORRECTION

| | | |
|---|---|---|
| PATENT NO. | : 7,275,298 B2 | |
| APPLICATION NO. | : 10/493346 | |
| DATED | : October 2, 2007 | |
| INVENTOR(S) | : Schindel | |

It is certified that error appears in the above-identified patent and that said Letters Patent is hereby corrected as shown below:

The title page showing an illustrative figure(s) 1 should be deleted and substitute therefore the attached title page consisting of Fig. 1.

The drawing sheets 1-4 consisting of Fig(s) 1-8 should be deleted and substitute therefore the attached drawing sheets consisting of Fig(s) 1-8.

Signed and Sealed this

Seventeenth Day of June, 2008

JON W. DUDAS
*Director of the United States Patent and Trademark Office*

(12) United States Patent
Schindel

(10) Patent No.: US 7,275,298 B2
(45) Date of Patent: Oct. 2, 2007

(54) ULTRASONIC PRINTED CIRCUIT BOARD TRANSDUCER

(76) Inventor: David W. Schindel, 460 Wilbrod Street, Suite 2, Ottawa, Ontario K1N 6M8 (CA)

(*) Notice: Subject to any disclaimer, the term of this patent is extended or adjusted under 35 U.S.C. 154(b) by 489 days.

(21) Appl. No.: 10/493,346
(22) PCT Filed: Oct. 23, 2002
(86) PCT No.: PCT/CA02/01601
§ 371 (c)(1),
(2), (4) Date: Apr. 22, 2004
(87) PCT Pub. No.: WO03/035281
PCT Pub. Date: May 1, 2003

(65) Prior Publication Data
US 2004/0261251 A1 Dec. 30, 2004

Related U.S. Application Data

(60) Provisional application No. 60/330,484, filed on Oct. 23, 2001.

(51) Int. Cl.
*H04R 31/00* (2006.01)
(52) U.S. Cl. .............. 29/594; 29/592.1; 29/609.1; 216/62; 216/66; 216/67; 310/334; 381/396; 381/398; 367/140; 427/79; 427/80
(58) Field of Classification Search .......... 29/592.1, 29/594, 609.1; 216/62, 66, 67; 310/334; 381/396, 398; 427/79, 80; 367/140
See application file for complete search history.

(56) References Cited

U.S. PATENT DOCUMENTS

| 4,993,072 A | 2/1991 | Murphy |
| 5,153,859 A * | 10/1992 | Chatigny et al. ........ 367/140 |
| 5,287,331 A * | 2/1994 | Schindel et al. ........ 367/140 |
| 5,475,606 A | 12/1995 | Muyshondt et al. ...... 364/489 |

FOREIGN PATENT DOCUMENTS

| EP | 04 99 237 | 8/1992 |
| GB | 2 231 235 | 11/1999 |

* cited by examiner

*Primary Examiner*—Paul D. Kim

(57) ABSTRACT

There is provided methods for producing an ultrasonic transducer assembly. The methods generally comprise the steps of creating a multi-layered rigid or flexible printed circuit board, having a top surface and bottom surface; creating a patterned conducting layer upon each of the top and bottom surface; creating at least one patterned backplate electrode on the board or as part of a discreet component which is then attached to the board; creating at least one conductive through-hole via integral with the board; roughening at least a portion of each of the at least one backplate to introduce gas pockets in that portion of a surface of the backplate; and attaching thin insulating or dielectric single or multi-layer film on a portion of the board in which the film has an integral conducting surface and in which the conducting surface is configured so as to form a capacitive structure with the at least one backplate.

51 Claims, 4 Drawing Sheets